United States Patent [19]
Venrooij

[11] Patent Number: 5,656,305
[45] Date of Patent: Aug. 12, 1997

[54] SYSTEM FOR DOSED CONVEYING AND SELECTING OF CYLINDRICAL PELLETS FOR MOLDING APPARATUS FOR LEAD FRAMES

[75] Inventor: Johannes Lambertus Gerardus Maria Venrooij, Duiven, Netherlands

[73] Assignee: Fico B.V., Didam, Netherlands

[21] Appl. No.: 491,877

[22] PCT Filed: Dec. 13, 1993

[86] PCT No.: PCT/EP93/03555

§ 371 Date: Jun. 23, 1995

§ 102(e) Date: Jun. 23, 1995

[87] PCT Pub. No.: WO94/14585

PCT Pub. Date: Jul. 7, 1994

[30] Foreign Application Priority Data

Dec. 23, 1992 [NL] Netherlands ............... 9202253

[51] Int. Cl.⁶ ..................... B29C 31/06; B29C 45/14
[52] U.S. Cl. ............. 425/145; 264/40.7; 264/272.17; 406/28; 406/34; 406/50; 406/83; 425/126.1; 425/172; 425/256; 425/544
[58] Field of Search ................... 425/121, 126.1, 425/145, 140, 169, 172, 256, 447, 449, 544, DIG. 228; 264/40.1, 40.7, 272.17; 406/34, 50, 28, 145, 83

[56] References Cited

U.S. PATENT DOCUMENTS

| | | | |
|---|---|---|---|
| 3,013,370 | 12/1961 | Vida | 425/449 |
| 3,028,625 | 4/1962 | Dawson | 425/449 |
| 4,752,198 | 6/1988 | Boschman | 425/145 |
| 4,781,559 | 11/1988 | Mathis et al. | 425/145 |
| 5,158,780 | 10/1992 | Schraven et al. | 425/256 |
| 5,252,008 | 10/1993 | May, III et al. | 406/34 |
| 5,297,897 | 3/1994 | Venrooij | 425/DIG. 228 |
| 5,356,280 | 10/1994 | Ponzielli | 425/449 |

FOREIGN PATENT DOCUMENTS

| | | | |
|---|---|---|---|
| 0295 382 | 4/1988 | European Pat. Off. | |
| 2 312 075 | 5/1976 | France . | |
| 2 368 422 | 10/1977 | France . | |
| 2607441 | 6/1988 | France | 425/169 |
| 62-231730 | 10/1987 | Japan | 425/449 |
| 2-163946 | 6/1990 | Japan | 425/169 |
| 1154105 | 5/1985 | U.S.S.R. | 425/449 |
| WO 93/01022 | 1/1993 | WIPO . | |

*Primary Examiner*—Jay H. Woo
*Assistant Examiner*—Duane S. Smith
*Attorney, Agent, or Firm*—Limbach & Limbach L.L.P.

[57] ABSTRACT

The invention relates to a system for dosed conveying and selecting of pellets for a moulding apparatus for lead frames, with which it is possible to prevent crumbled pellets or fragments and/or dust thereof being able to reach the molding apparatus arranged in a so-called clean room. For this purpose the system has structure for successively conveying pellets one by one, structure for selecting to length and feeding pellets to a transporting path, structure for reducing the transporting speed of conveyed pellets, structure for separating the pellets one by one and tranferring the pellets to a transport carrier, and means for transferring pellets from the transport carrier to a conveying device to a mold of a molding apparatus.

15 Claims, 9 Drawing Sheets

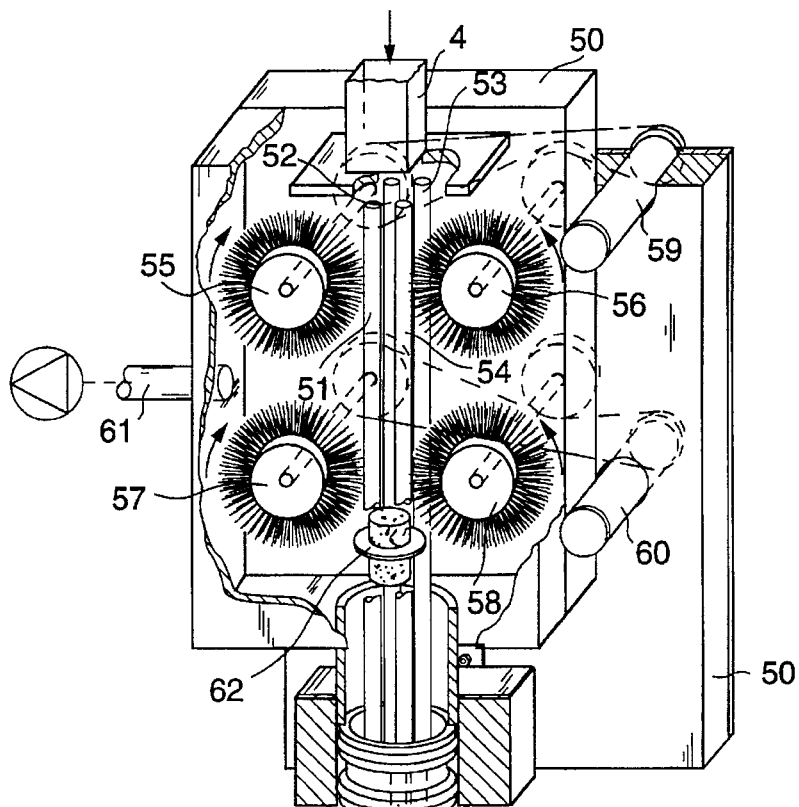
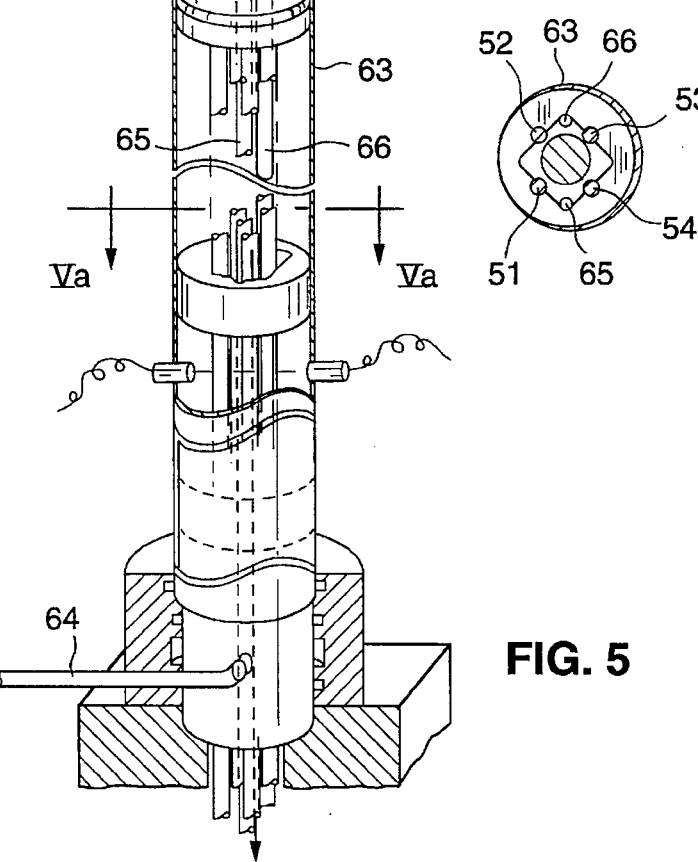
FIG. 5a
FIG. 5

SYSTEM FOR DOSED CONVEYING AND SELECTING OF CYLINDRICAL PELLETS FOR MOLDING APPARATUS FOR LEAD FRAMES

BACKGROUND OF THE INVENTION

The invention relates to a system for dosed conveying and selecting of cylindrical pellets for molding apparatus for lead frames.

A chip is mounted onto a central part of a lead frame intended for this purpose and the connecting points of the chip are connected with thin wires to the strip-like leads of the frame. Thereafter the leads and wiring are encapsulated with a protective plastic in a molding apparatus. In such molding apparatus pill or pellet-like units of plastic material are used which become plastic under temperature and pressure and are fed in this state to the lead frame situated in the mould cavity. The environment in which molding takes place is clean, a clean room or clean environment.

Due to the nature of the material the pellets are sources of contamination. This may be the result of crumbling of the pellet whereby dust formation and like contamination occur. It is therefore the object to keep the pellet, and particularly broken off pieces and other contaminating portions, outside the clean environment of the molding apparatus. Only pellets which can be properly processed, that is, without broken off fragments and the like, must be fed to the molding apparatus. On their way from a reservoir to the molding apparatus pellets can be damaged. The handling and transport must therefore take place very carefully.

SUMMARY OF THE INVENTION

The above outlined objectives of the invention are achieved using a system for dosed conveying and selecting of pellets for a molding apparatus for lead frames, comprising:

means for successively conveying pellets one by one, means for selecting to length and feeding pellets to a transporting path, means for reducing the transporting speed of conveyed pellets, means for separating the pellets one by one and transferring the pellets to a transport carrier, and means for transferring pellets from the transport carrier to a conveying device to a mold of a molding apparatus.

With reference to embodiments the invention will be further elucidated.

BRIEF DESCRIPTION OF THE DRAWINGS

FIG. 5 shows a braking device according to the invention in perspective view, FIG. 5a shows a section along the line Va—Va in FIG. 5.

DESCRIPTION OF THE PREFERRED EMBODIMENTS

Figure 1:
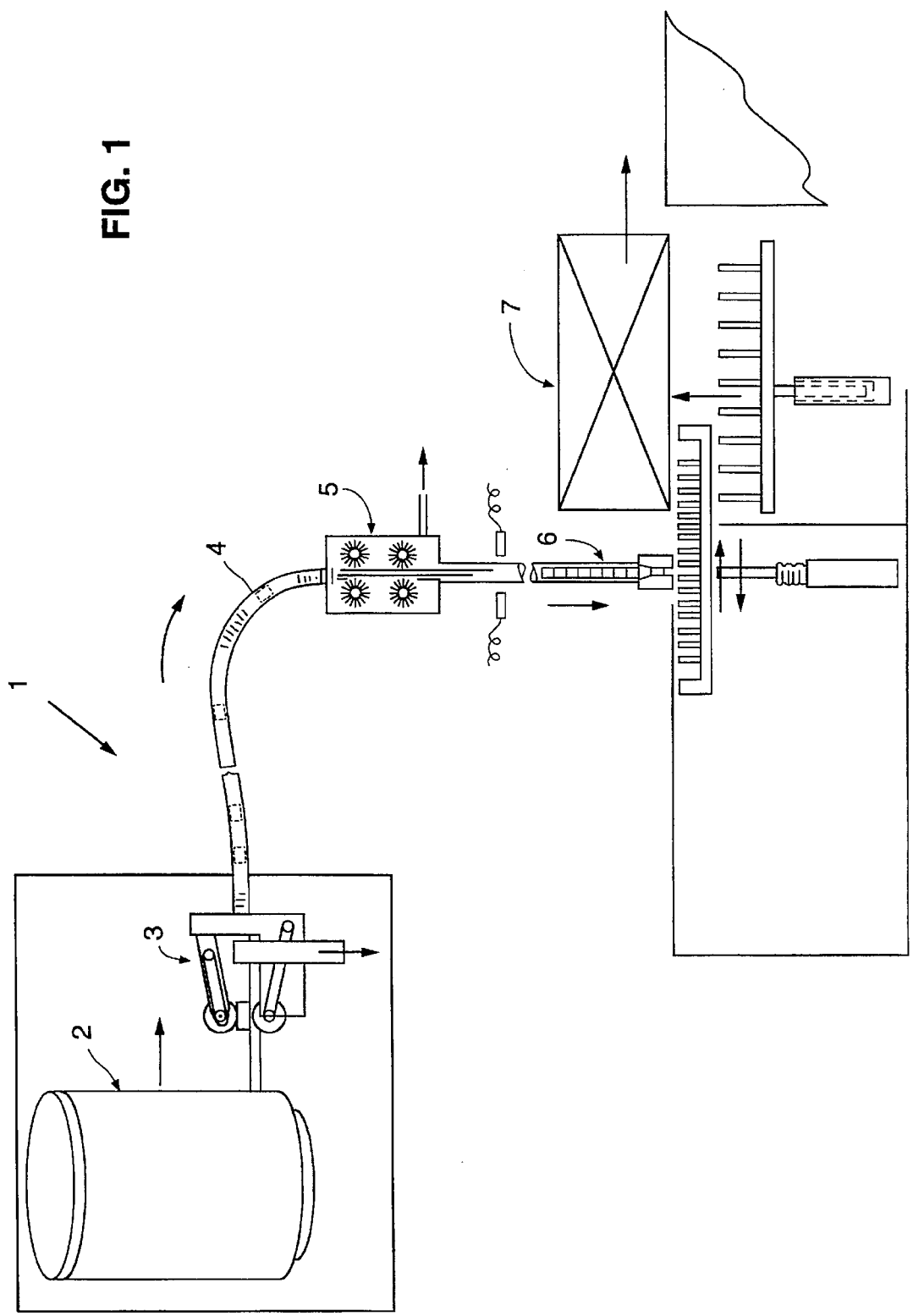
FIG. 1 is a schematic view of the system according to the invention.

The system 1 according to the invention comprises a supply-feed device 2, and infeed and selection device 3, a hose 4, a braking device 5, a pellet separating device 6 and a transporting device 7. A stock of pellets is placed in the supply-feed device 2 and successively conveyed therefrom one by one to the infeed and selection device 3. In the selection device 3 the damaged, i.e. not wholly cylindrical, pellets and fragments are sorted and removed. The accepted pellets are fed one by one to the hose and, using vacuum means, are transported to the braking device 5. The pellets conveyed at relatively high speed are decelerated in the braking device 5 and fed to a buffer forming part of a pellet separating device 6. One by one and synchronously with the action of the transporting device 7 the pellets are then fed to a molding apparatus for encapsulating chip-carrying lead frames.

The components 2 and 3 are placed in a housing (FIG. 1) in order to obtain a separation between a high dust level and a low dust level environment.

The system according to the invention reduces the chance of breakdown and the conveying of pellets not meeting the set requirements, for instance broken pellets, pellets with non-smooth edges which can jam in the transporting paths, including the hose 4, and the like. The system 1 further ensures that the pellets are held as long as possible outside the molding apparatus. This is important since the molding apparatus functions in principle in a clean room environment, while due to the nature of the material the pellets produce dust. The ambient temperature inside the molding apparatus also amounts to roughly 60° to 70° C., while curing of the pellets already begins at about 35° C. It is therefore recommended to keep the supply-feed device 2 and the infeed and selection device 3 outside the molding apparatus.

Figure 2:
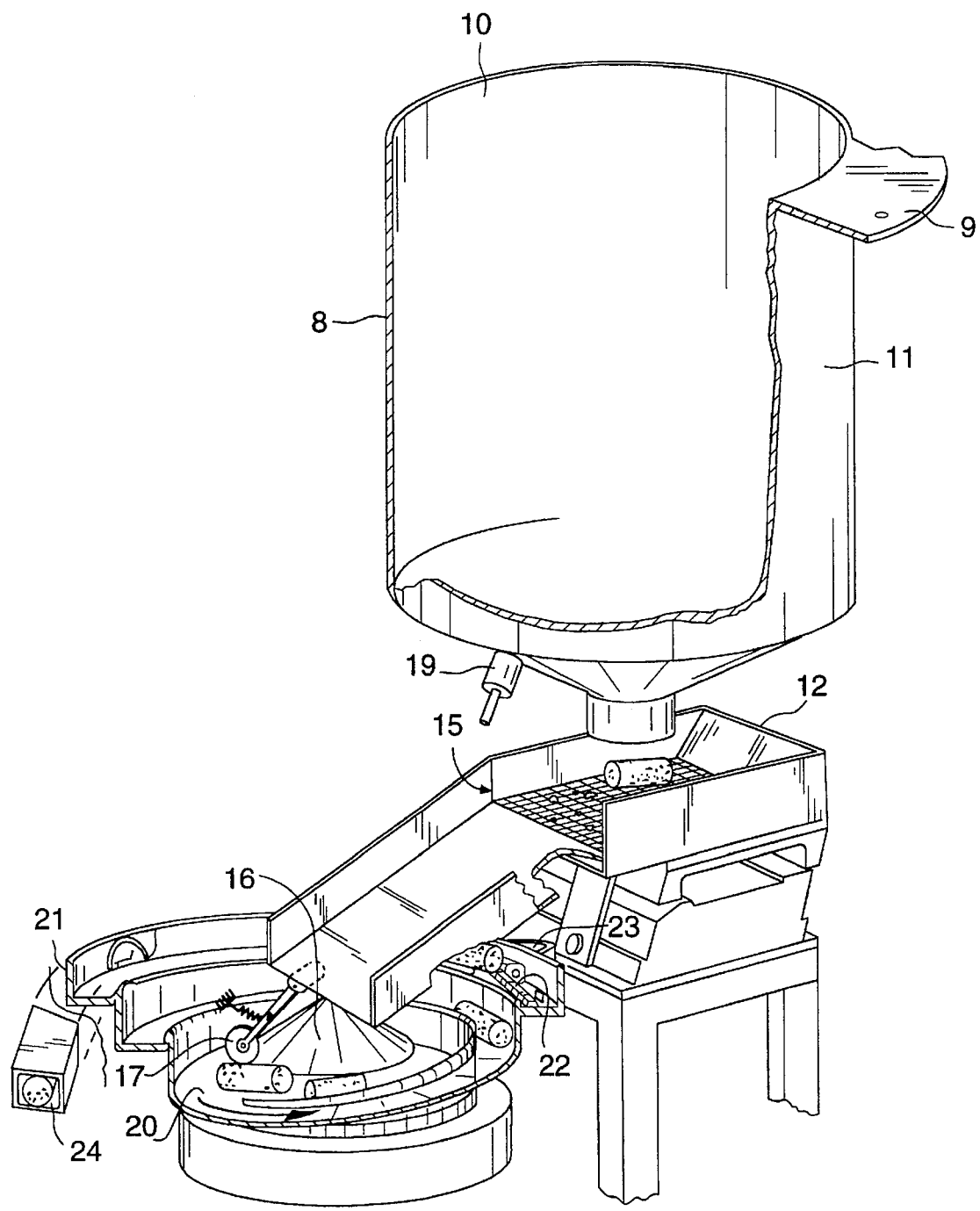
FIG. 2 is a cut away perspective view of a supply and feed device according to the invention.

The supply-feed device as in FIG. 2 comprises a cylindrical housing 8 with an upper wall 9. Via an intake opening 10 pellets are placed in a hopper 11. Placed on the underside of the hopper is a supply sensor 19 which by capacitative means measures the stock of pellets in a lower portion of the hopper and generates a signal with which the feed of the pellets to the hopper is controlled. On the discharge end of the hopper is situated a sieve-like shaking trough 12 which is moved oscillatingly in horizontal direction by a so-called linedriver, for instance as commercially available from AEG under the type specification KR2. Although the linedriver is recommended, other oscillating drives, such as for instance an eccentric drive, are also suitable. Situated on the open discharge side 15 of the shaking trough 12 is a feeding device 20 which comprises a spirally-running path 21. In this path a conical member 16 is arranged to prevent accumulation of pellets. A detection switch 17 is further placed close to the guide path 21 to indicate the level of the pellets in the path. Fragments of pellet material are sieved out in the shaking trough. Pellets meeting requirements as far as damage is concerned are fed through the opening 24 to the connecting line to the infeed and selection device.

Figure 3:
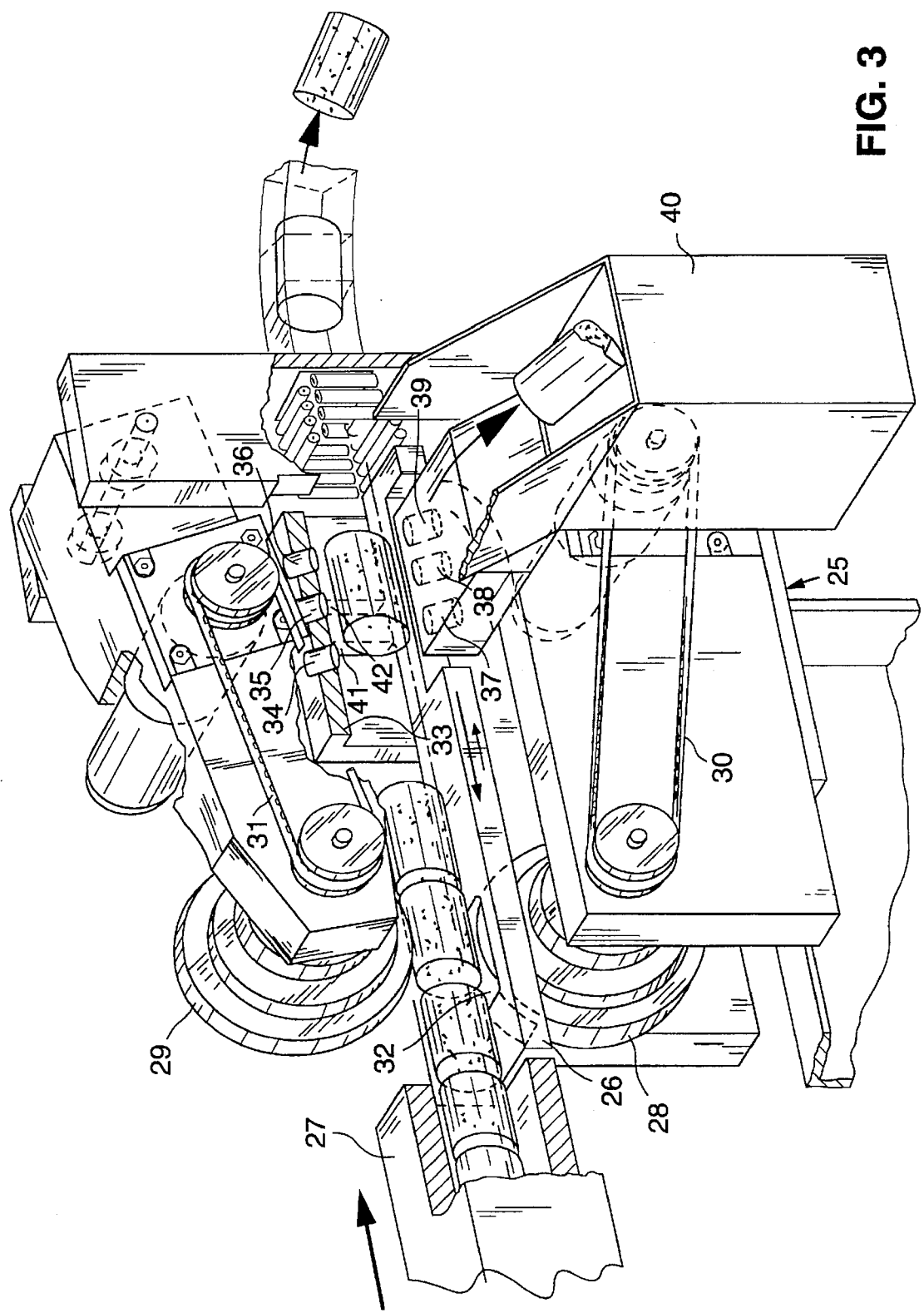
FIG. 3 is a perspective view of an infeed and selection device.

The infeed and selection device 3 is drawn in detail in FIG. 3. The selection device 3 comprises a frame 25 and a guide path 26 which performs a reciprocating movement such that the speed in the conveying direction (P1) is lower than in the return direction (P2). The pellets are conveyed via the duct 27 connected to the pellet hopper 2. Of the successive stream of pellets one is gripped at a time by the co-acting rollers 28, 29 which are driven synchronously over the respective toothed belts 30, 31. The roller 28 protrudes through a slot 32 into the guide path 26. By continuously driving the rollers 28, 29 in combination with the guide path 26 the pellets are conveyed one by one to the selection part 33. Disposed in lengthwise direction of the guide path are three sensors 34, 35, 36 which co-act with corresponding photocells 37, 38, 39. Only the pellets of the correct length are rated acceptable and continue on their way to the hose 4, as shown in FIG. 1. Non-accepted pellets are discharged sideways to a collection reservoir 40 by means of compressed air. Air under pressure is discharged via the channels 41, 42. When a pellet not meeting the requirements is detected, the relevant pellets are ejected sideways by means of an air pulse.

Figure 4:
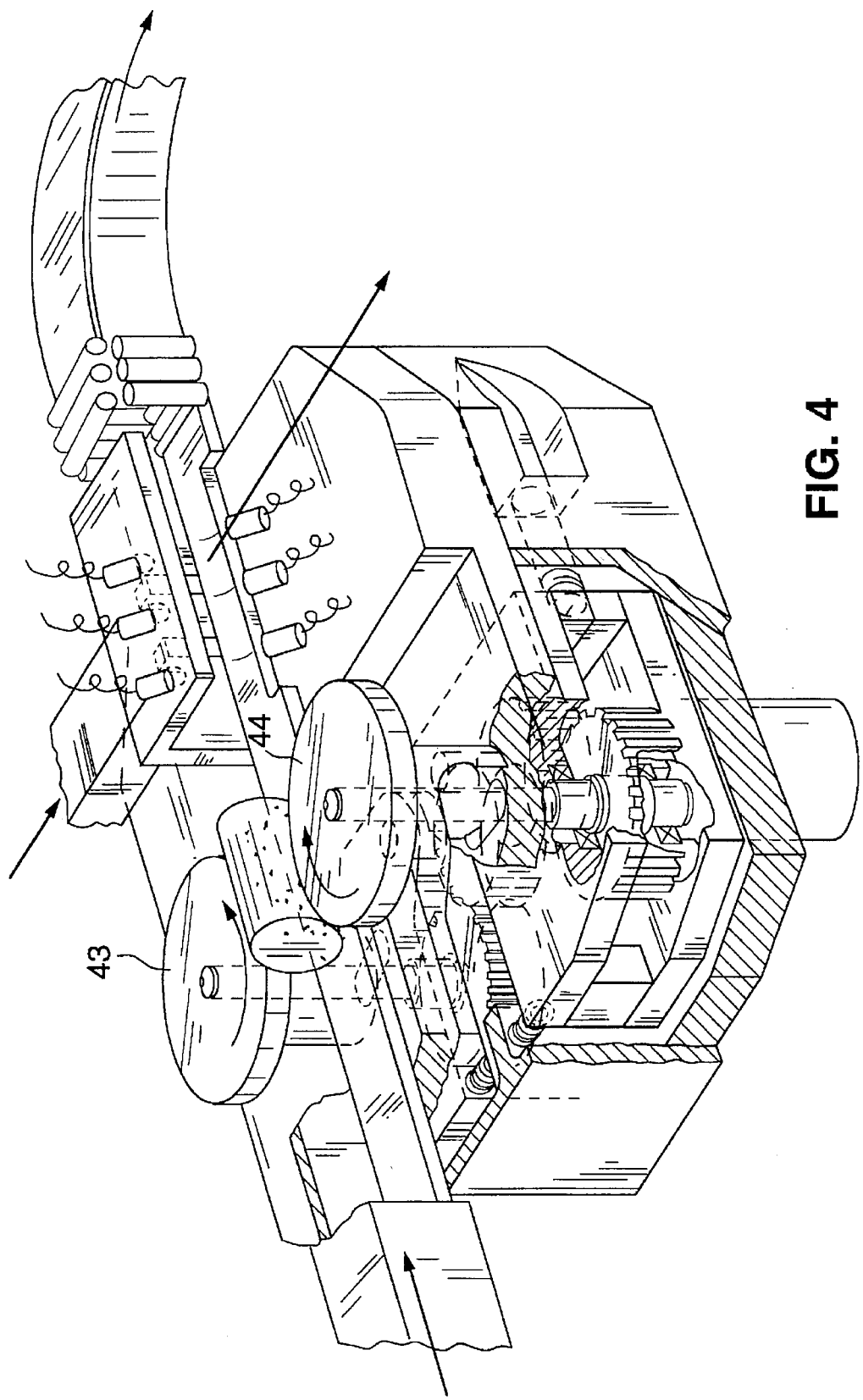
FIG. 4 shows an alternative embodiment of the infeed and selection device according to FIG. 3.

FIG. 4 shows an alternative embodiment of the infeed and selection device according to FIG. 3. In this case rollers 43 and 44 for gripping and conveying the pellets are disposed horizontally. The operation is in principle the same as that of the device according to FIG. 3.

After leaving the infeed and selection device of FIG. 3 respectively FIG. 4, the transport through the hose 4 begins. This transport is possible because, using a vacuum device, a pressure difference is generated between the beginning of a hose and the end thereof. After transport through the hose 4 the pellet reaches a braking device 5 (FIG. 5). The latter comprises a chamber 50 in which vacuum prevails and in which hose 4 ends. Disposed inside the chamber 50 are four cylindrical pipes 51, 52, 53, 54 which bound a passageway for a pellet. Along the passageway are placed co-acting brushes 55, 56, 57, 58, the bristles of which extend between the adjoining pipes. The bristles are driven group-wise from the shafts 59 and 60. The vacuum in the chamber 50 is maintained via a suction device connected to the pipe 61. The pair of brushes 55, 56 rotates relatively rapidly compared to the pair of brushes 57, 58. Through the action of the pairs of brushes pellets are conveyed to a membrane 62 in which is arranged an opening the size of the diameter of a pellet. Because the opening in membrane 62 is closed off by a pellet, the suction action of the vacuum falls away on the underside of the pellet as seen in the drawing so that the pellet remains "suspended" in the opening. When a following pellet is conveyed by the pairs of brushes, the pellet present in the opening of membrane 62 is pushed further so that the opening is cleared until the following downward pushing pellet remains suspended in the membrane opening and the vacuum is restored. Because the opening in membrane 62 has substantially the same diameter as the pellet, there occurs practically no wear of membrane 62.

Figure 6:
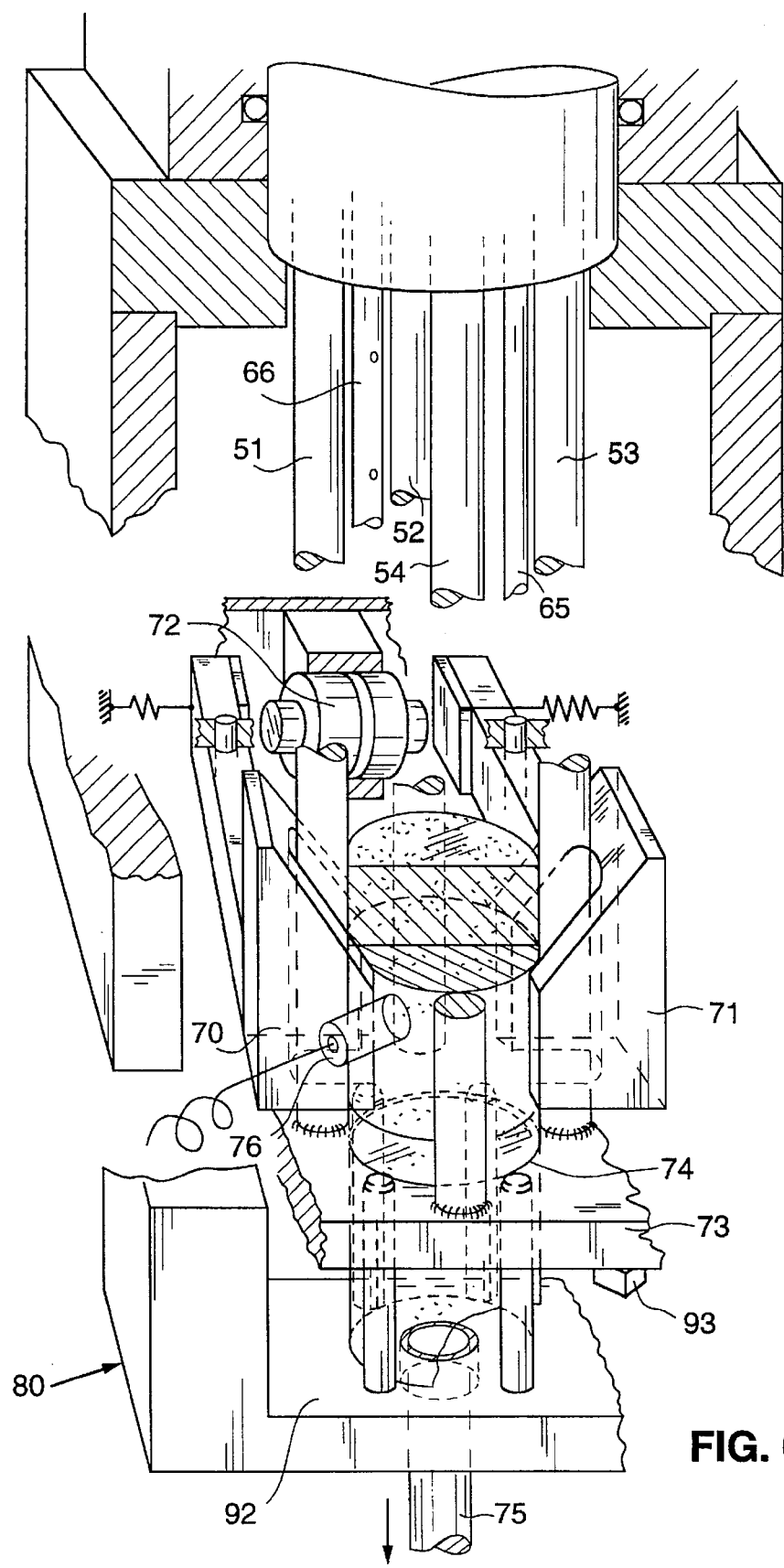
FIG. 6 is a perspective view of a pellet separating device according to the invention.

Connecting onto chamber 50 is a cylindrical pipe 63 inside which the pressure and temperature are controlled by a pressure cooler which is connected to pipe 64. According to FIG. 5, also present in the cylindrical pipe 63 in addition to pipes 51, 52, 53, 54 bounding the passageway are cooling air supply pipes 65, 66 in the wall of which are arranged outlet openings for cooling air. A pellet subsequently enters a pellet separating device which is drawn in detail in FIG. 6. In the separating device a pellet is clamped between two lamps 70, 71 movable relative to one another in horizontal direction. The movement of the pair of clamps 70, 71 is determined by the action of the pneumatic unit 72. Situated on the underside is a base plate 73 in which is arranged a passage opening 74, the diameter of which is greater than the diameter of a pellet. A plunger 75 is movable vertically up and downward and can extend to the opening 74 in the base plate 73.

Three sensors are present. A first sensor 76 indicates whether a pellet is present in the separating device.

A second sensor 93 indicates whether the space between base plate 73 and the transport carrier 80 is free of pellets. Should this be the case, the carrier can be displaced horizontally. A third sensor (not drawn) monitors whether the pellets are loaded onto the transport carrier 80.

Figure 7:
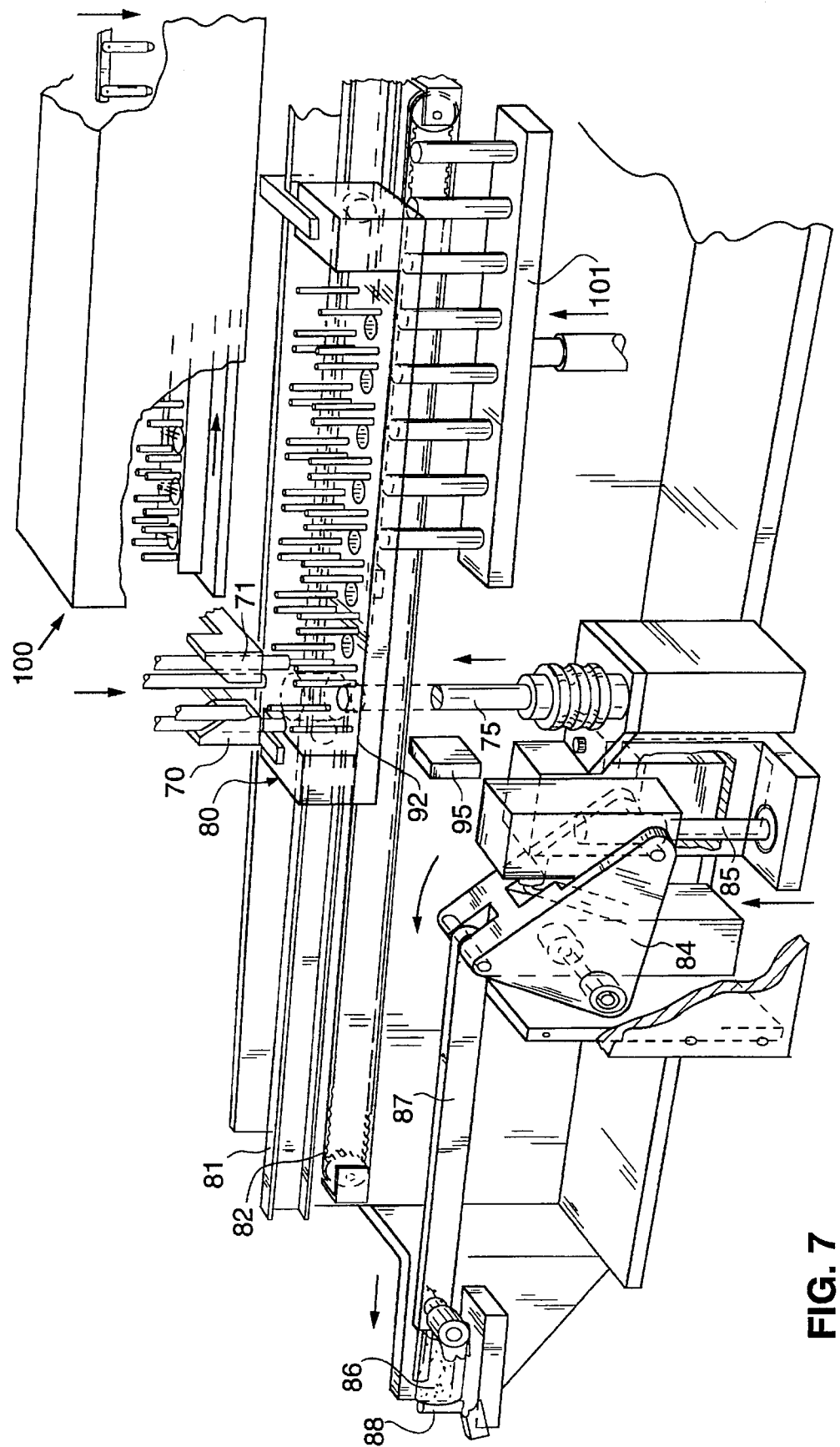
FIG. 7 is a dosing device according to the invention in perspective view.

In the position of the plunger 75 extending into the opening 74 the plunger grips the underside of the pellet. The plunger 75 then moves through a pellet height in downward direction, whereby a following pellet will drop precisely between the clamps 70, 71. When this pellet is clamped into the pair of clamps 70, 71 the plunger 75 is moved further downward whereby the pellets are carried onto the base plate 92. The base plate 92 has a number of openings 110 for receiving pellets. The base plate 92 is displaced according to an indexing movement. The diameter of the pellet is larger than the passage opening for the plunger 75. The take up of a pellet thus takes place in two steps. The first step is performed with plunger 85, the second with plunger 75. The adjustment of the stroke length of the first step is carried out by rocker 84, the stroke length of which is determined by the pellet 86 placed between the lever arm 87 and the stop 88. The following pellet is meanwhile clamped in by the pair of clamps 70, 71. The base plate 92 (see FIG. 7) forms part of the transport carrier 80. The carrier is horizontally movable along a guide path 81. Driving takes place through a toothed belt 82. A stop 95 limits the movement stroke.

Through displacing of plunger 85 the plunger 75 is moved upward to above the base plate 92 through the stroke defined by the adjusted length as the plunger 85 is coupled to plunger 75. The pellets standing on the plunger therefore support the pellets present in the separating device. The following pellets are then clamped by the clamps 70, 71.

After clamping by means of clamps 70 and 71 the plunger 75 is moved downward to the lowest position. The plunger moves below the base plate 92 so that the pellets come to rest on the base plate 92. Supply carrier 100 can then displace horizontally.

Figure 8:
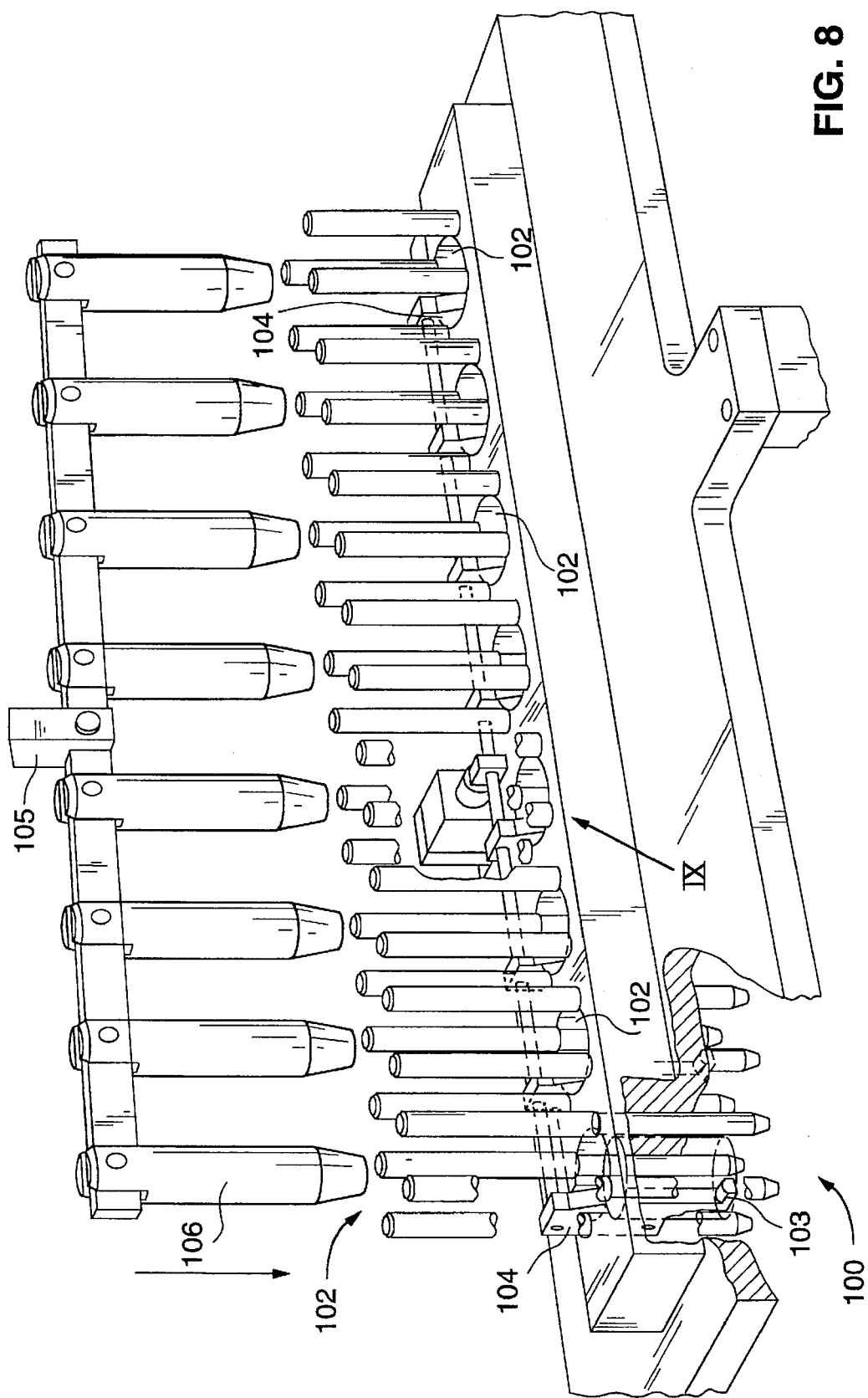
FIG. 8 is a perspective view of a transporting device according to the invention.

FIG. 8 shows the supply carrier 100 which is placed apparatus. The pellets carried by the transport carrier are transported by an indexing movement to the supply carrier 100. Here they are simultaneously carried upward by means of the cylindrical pusher members 101 into a space 102 enclosed by four guide pins. By actuating a rocker 104 provided with a supporting finger 103 and serving as pick-up means the pellet is subsequently supported by the finger 103. Hereafter transport takes place to a position above the mold where the pellets are processed. In this position the rocker member 104 is moved back to the inactive position and, using an ejector member 105 with downward oriented cylindrical elements 106, the pellet is carried from its position between the quides into the mould. The ejector member 105 is not driven but moves downward as a result of the force of gravity. Because the pellet is received between four guide pins a relatively open space is created so that the danger of jamming of the pellet as a consequence of dust and the like is obviated.

Figure 9:
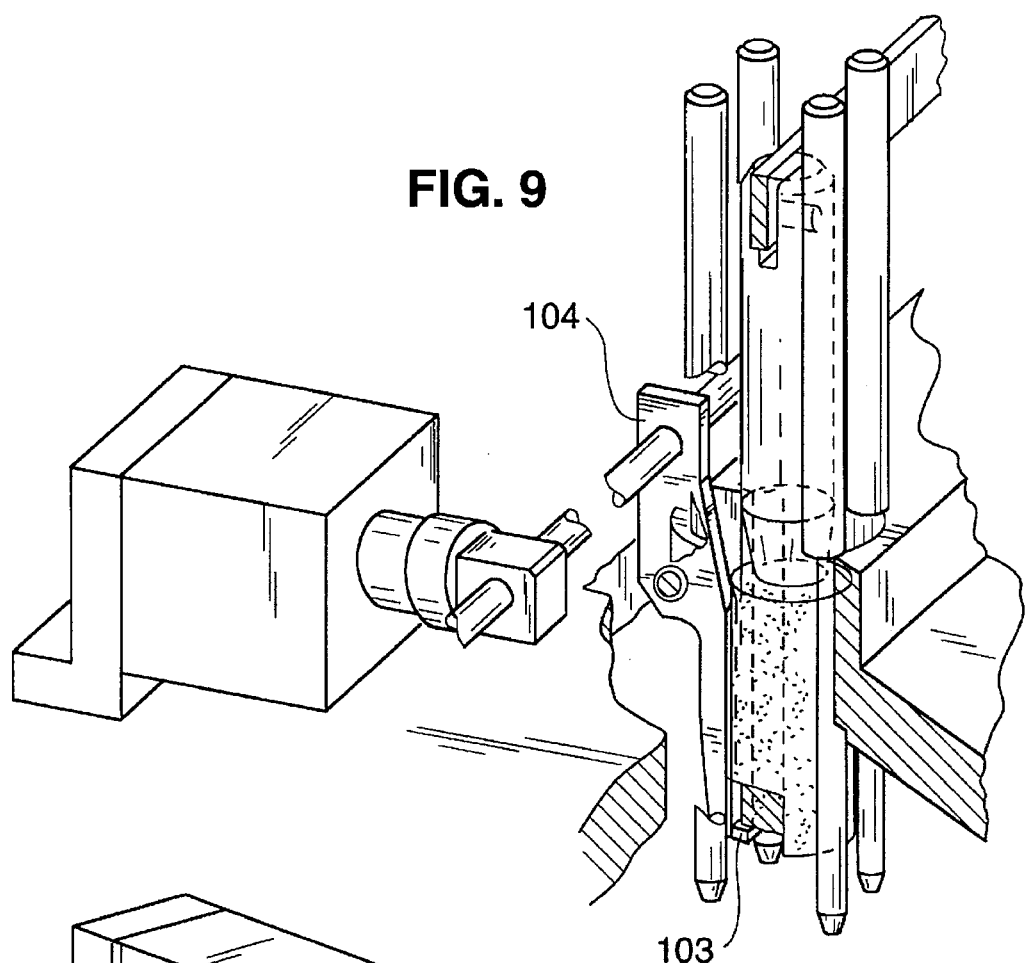
FIG. 9 shows a detail IX of FIG. 8.
Figure 10:
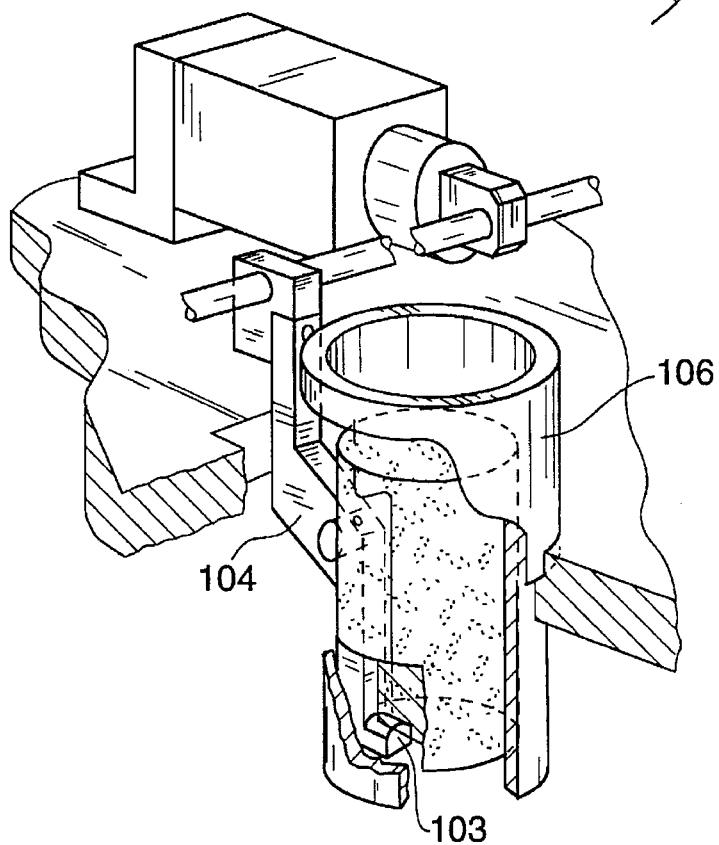
FIG. 10 shows an alternative embodiment of the device according to FIG. 9.

According to an alternative embodiment as according to FIG. 9, a cylindrical sleeve 106 is chosen as guiding in which a received pellet can be supported using a rocker 104 provided with a finger 103. The operation is otherwise the same as in the embodiment of FIG. 8.

I claim:

1. A system for dosed conveying and selecting of pellets for a molding apparatus for lead frames comprising:

infeed and selection means for successively conveying pellets one by one, selecting said pellets by length, and for feeding pellets to a transporting path;

braking means for reducing the transporting speed of conveyed pellets along said transporting path, said braking means including a pellet outlet;

pellet separating means positioned along said transporting path to receiving pellets from said outlet of said braking means and for separating the pellets one by one and transferring the pellets to a transport carrier; and transferring means for transferring pellets from the transport carrier to a mold of a molding apparatus.

2. A system as claimed in claim 1, wherein said infeed and selection means comprises a hopper, the discharge end of which delivers pellets onto a shaking sieve.

3. A system as claimed in claim 2, wherein said infeed and selection means further includes a spiral guide path positioned to receive pellets from an outlet of said sieve.

4. A system as claimed in claim 1, wherein said infeed and selection means further includes sensors for determining the length of a pellet, an output of which sensors is connected to means for removing from the transporting path a pellet determined to be of insufficient length.

5. A system as claimed in claim 4, wherein the means for removing a pellet includes at least one nozzle connected to a source of compressed air.

6. A system as claimed in claim 1, wherein said infeed and selection means further includes a synchronously driven pair of wheels extending into the guide path, and the guide path includes means for performing a reciprocating lengthwise movement, wherein a speed in the transporting direction is lower than in the return direction.

7. A system as claimed in claim 1, wherein said braking means comprises pairs of rotating brushes which extend into said transporting path, wherein a first pair of said brushes which contact a pellet have a higher rotational speed than a second subsequent pair of brushes, a membrane placed along said path adjacent to said second pair, said membrane having a passage opening adapted to the size of a diameter of a pellet, and means for generating underpressure.

8. A system as claimed in claim 7, wherein said braking device further comprises cooling air supply pipes in a wall thereof for supplying cool air under pressure.

9. A system as claimed in claim 1, wherein said pellet separating means includes a base plate, at least one plunger which can extend through an opening in the base plate and pellet clamping means positioned adjacent and extending into the guide path.

10. A system as claimed in claim 9, wherein said base plate forms part of a dosing device for picking up and conveying pellets.

11. A system as claimed in claim 9, wherein said base plate has openings for receiving a number of successive pellets, and said base plate is movable in accordance with an indexing movement into an end position in register with pusher members which can extend into corresponding openings.

12. A system as claimed in claim 10, wherein a supply carrier is displaceable between a position above and in register with said base plate of said dosing device and a position located at a horizontal distance therefrom, and the supply carrier includes pick-up means including a pellet receiving opening for receiving a pellet, rocker members, each of which rocker members includes a rocker finger, and wherein said members are rotatable between a first position in which said finger supports a pellet which is in said opening and a second position in which the finger is moved to permit the passage of a pellet to or from said opening.

13. A system as claimed in claim 12, wherein said pick-up means further includes a number of pins disposed around said opening.

14. A system as claimed in claim 13, wherein each pick up member further includes a cylindrical sleeve positioned above each said opening.

15. A system for dosed conveying and selecting of pellets for a molding apparatus for lead frames comprising:

infeed and selection means for successively conveying pellets one by one, selecting said pellets by length and removing those pellets of insufficient length, and for feeding remaining pellets to a transporting path;

braking means for reducing the transporting speed of conveyed pellets along said transporting path, said braking means including a pellet outlet;

pellet separating means positioned along said transporting path to receiving pellets from said outlet of said braking means and for separating the pellets one by one and transferring the pellets to a transport carrier; and transferring means for transferring pellets from the transport carrier to a mold of a molding apparatus.

* * * * *